(12) United States Patent
Heid

(10) Patent No.: US 6,342,786 B1
(45) Date of Patent: Jan. 29, 2002

(54) MAGNETIC RESONANCE TOMOGRAPHY APPARATUS AND METHOD IN THE FORM OF A FREQUENCY-SELECTIVE AND LOCATION-SELECTIVE RF PULSE SEQUENCE FOR OPERATING SAME

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/483,025

(22) Filed: Jan. 13, 2000

(30) Foreign Application Priority Data

Jan. 13, 1999 (DE) .......................................... 199 01 007

(51) Int. Cl.$^7$ ................................................ G01V 3/00
(52) U.S. Cl. ........................ 324/309; 324/307; 324/318
(58) Field of Search ................................ 324/309, 307, 324/318, 322

(56) References Cited

U.S. PATENT DOCUMENTS

| | | | |
|---|---|---|---|
| 4,739,266 A | 4/1988 | Kunz | ........................ 324/309 |
| 4,847,559 A | 7/1989 | Keren | ........................ 324/307 |
| 4,902,973 A | 2/1990 | Keren | ........................ 324/312 |
| 5,510,713 A | 4/1996 | Bernstein | ..................... 324/309 |

FOREIGN PATENT DOCUMENTS

| | | | | |
|---|---|---|---|---|
| EP | 0 745 865 | 12/1996 | ......... | G01R/33/485 |

*Primary Examiner*—Hezron Williams
*Assistant Examiner*—Brij B. Shrivastav
(74) *Attorney, Agent, or Firm*—Schiff Hardin & Waite

(57) ABSTRACT

A magnetic resonance tomography apparatus has an RF unit for generating RF pulses and a magnet arrangement for generating a constant magnetic field and a magnetic field gradient superimposed thereon. The RF unit generates a frequency-selective and location-selective RF pulse sequence for resonant nuclear magnetic excitation of a first medium and suppression of the excitation of a second medium. The frequency spectrum of the pulses is selected such that the spatial resonant region of pulses for the second medium at a first polarity of the magnetic field gradient essentially coincides with the spatial resonance region of RF pulses of opposite polarity of the magnetic field gradient.

3 Claims, 2 Drawing Sheets

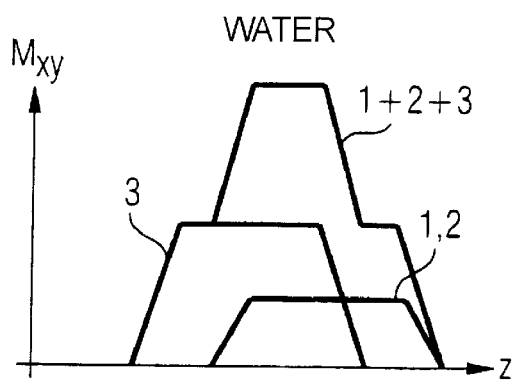
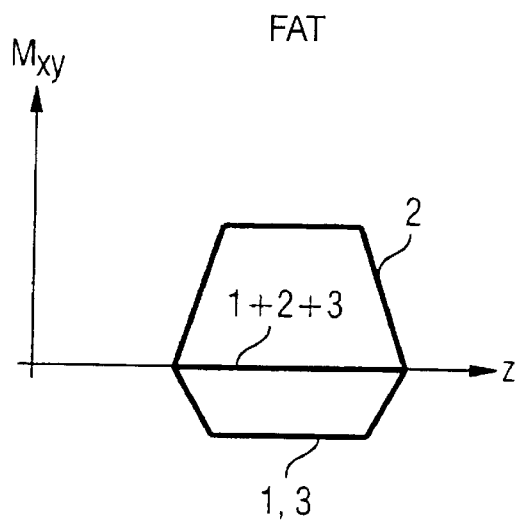
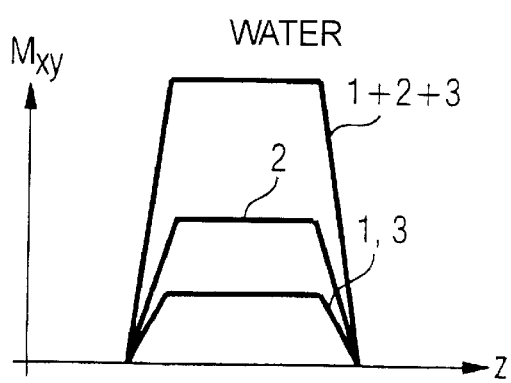
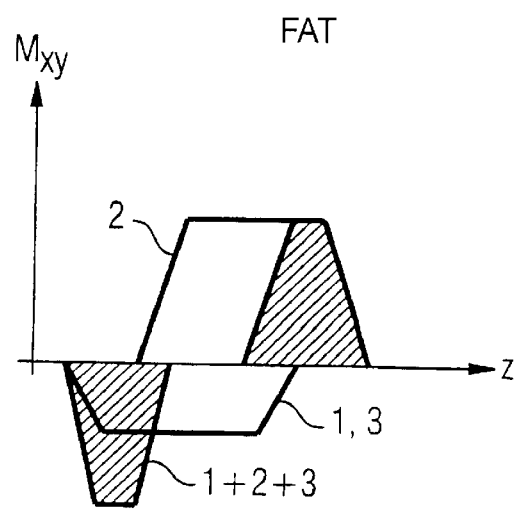

MAGNETIC RESONANCE TOMOGRAPHY APPARATUS AND METHOD IN THE FORM OF A FREQUENCY-SELECTIVE AND LOCATION-SELECTIVE RF PULSE SEQUENCE FOR OPERATING SAME

BACKGROUND OF THE INVENTION

1. Field of the Invention

The present invention is directed to a frequency-selective and location-selective RF pulse sequence for a magnetic resonance apparatus and to a magnetic resonance tomography apparatus for generating such an RF pulse sequences.

2. Description of the Prior Art

In magnetic resonance tomography, the sharp resonant behavior of the nuclear magnetization of magnetic nuclei in biological tissue is utilized for generating an in vivo image of the human body with the assistance of a radio frequency field in the megahertz range and a location-dependent magnetic field. All atomic nuclei having an uneven atomic number have an intrinsic rotational axis, and therefore a nuclear magnetic moment. By far the greatest registerable sensitivity, however, exists for protons, i.e., the nuclei of hydrogen atoms. The exact nuclear resonant frequency (Larmor frequency) is dependent on the chemical environment of the respective proton. For example, the resonant frequency of hydrogen nuclei in free water compared to those participating in an aliphatic bond (fat) is shift by approximately 3 ppm (parts per million), i.e. approximately 130 Hertz given a field strength of 1.0 Tesla.

Since, in magnetic resonance tomography, the location information is encoded in frequencies on the basis of the magnetic gradient field, i.e. the nuclear magnetic resonant frequency changes along the gradient direction (slice normal), a spatial shift of the fat image part compared to the water image part occurs, which is represented as:

$\Delta x = \Delta f \times B_0 / G_r$.

$\Delta x$ Spacial shift due to the chemical shift
$\Delta f$ Resonant frequency between water and fat protons
$B_0$ Magnetic field strength
$G_r$ Readout magnetic field gradient The method for spatial resolution in magnetic resonance tomography is explained in H. Morneburg, "Bildgebende Systeme für die medizinische Diagnostik", Erlangen, 1995, Chapter 6.2, and the chemical shift is explained in Chapters 11.2.2 and 11.3.4.2.

The chemical shift between water and fat imaging is undesirable for many diagnostic applications. Methods for suppressing the chemical shift are therefore known wherein, for example, the fat signal is suppressed and only the water signal is presented. Such methods and apparatuses for the presentation of biological tissue with magnetic resonance tomography are disclosed, for example, in European Application 0 745 865 and U.S. Pat. No. 5,510,713 as well as German OS 38 10 018 and German OS 38 04 212. In the apparatuses and methods disclosed in these documents, a sequence of RF pulses having specific properties for nuclear magnetic excitation of a first medium, for example water, and for suppression of the excitation of a second medium, for example fat, is employed. Some of the known apparatuses and methods thus enable the selective presentation of a first medium, for example water, and of a second medium, for example fat, dependent on the desired application. German OS 35 43 854 discloses a nuclear magnetic resonance tomography method and an arrangement for the implementation of the method, wherein a pulse sequence of three RF pulses with bipolar magnetic field gradients is employed in order to generate images that only show the fat distribution, or images that only show the water distribution.

In another known method for suppressing the chemical shift, for example, a suppression of the fat signal and an exclusive presentation of the water signal are achieved by a pulse sequence of RF excitation pulses that are exactly matched in time, with which only the water protons are selectively excited, whereas nuclear magnetic excitation of fat protons is suppressed. The method is schematically shown In FIGS. 3 A and 3B herein, FIG. 3A shows the RF pulses and FIG. 3B shows the magnetic field gradient $G_z$ in the slice normal. The first RF pulse at time $t_1$ generates, for example, a rotation of the precessional angle of the nuclear magnetic moments by an angle $\alpha/4$. The second RF pulse at time $t_2$ generates an angular change by $\alpha/2$, and the third pulse at time $t_3$ in turn produces an angular change by $\alpha/4$, When the three RF pulses are emitted in phase, an overall angular modification by $\alpha$, for example 90°, occurs for the resonant nuclei. For selective excitation of only the water protons, the time interval $t_2-t_1$ of the first two pulses and $t_3-t_2$ of the second and third pulses is selected such that a phase shift of exactly 180° occurs in this time period between the processing hydrogen protons and fat protons, The angular shifts of the fat protons generated by the individual RF pulses do not add, but subtract. The angular modifications in the water and fat protons therefore are as follows;

Water: $0 \to \alpha/4 \to \alpha/4 \to 3\alpha/4 \to 3\alpha/4 \to \alpha$

Fat: $0 \to \alpha/4 \to -\alpha/4 \to \alpha/4 \to -\alpha/4 \to 0$.

The first, third and fifth arrows respectively denote the angular change due to the first, second and third RF pulse and the second and fourth arrows indicate the angular change due to free precession.

An excitation of only the water protons thus is obtained. The fat protons generate no signal in a following measurement (readout). This suppression, however, is not complete, due to the reversed magnetic field gradients at the second RF pulse compared to the first and third RF pulses. The spatial region in which the phase relationship between the individual pulses is satisfied for both directions of the magnetic field gradient is very narrow at best. The fat suppression is therefore incomplete in edge regions lying next to this region at both sides thereof, and (disturbing) fat signals occur.

SUMMARY OF THE INVENTION

An object of the present invention is to provide a frequency-selective and location-selective RF pulse sequence for a magnetic resonance apparatus wherein a dependable suppression of the excitation of a second medium, for example fat, is achieved.

This object is achieved in a magnetic resonance imaging method in the form of a frequency-selective and location-selective RF pulse sequence with bipolar, selective magnetic field gradients for nuclear magnetic excitation of a first medium and suppression of the excitation of a second medium, wherein the frequency spectrum of the pulses is selected such that the spatial resonance range of pulses for the second medium, given a first polarity of the magnetic field gradient, essentially coincides with the spatial resonant region of the RF pulses having opposite polarity of the magnetic field gradient. Due to the frequency compensation for the medium to be suppressed, a nearly complete suppression of the signals from this medium, for example fat, can be achieved. The attenuation of the signal from the first medium which occurs as a side effect is therefore of little consequence compared to the image quality that can be achieved.

The pulse sequence preferably includes three pulses that are equidistantly spaced in time, whereby the two outer pulses effect a rotation of the nuclear magnetization of the first and second media by a first angle and the middle pulse effects a rotation of the nuclear magnetization of the first medium by twice the amount of the first angle in the same direction, and effects a rotation of the nuclear magnetization of the second medium by twice the angle in the opposite direction. The selection of the angles can be made at the discretion of a person skilled in the art corresponding to the particular application.

The spacing between the pulses is preferably selected such that it corresponds to a phase difference of 180° between the precessing nuclear magnetization vectors of the two media.

The invention is also directed to a magnetic resonance tomography apparatus having an RF unit for generating RF pulses and a magnet arrangement for generating a constant magnetic field and a magnetic field gradient superimposed thereon, wherein the RF unit operates to generate the frequency-selective and location-selective RF pulse sequence described above.

DESCRIPTION OF THE DRAWINGS

FIG. 1A shows the nuclear magnetization of the first medium along the slice normal according to the invention.

FIG. 1B shows the nuclear magnetization of the second medium along the slice normal according to the invention.

FIG. 2A shows the nuclear magnetization of the first medium along the slice normal with a conventional method.

FIG. 2B shows the magnetization of the second medium along the slice normal given the traditional method.

DESCRIPTION OF THE PREFERRED EMBODIMENTS

Figure 3A:
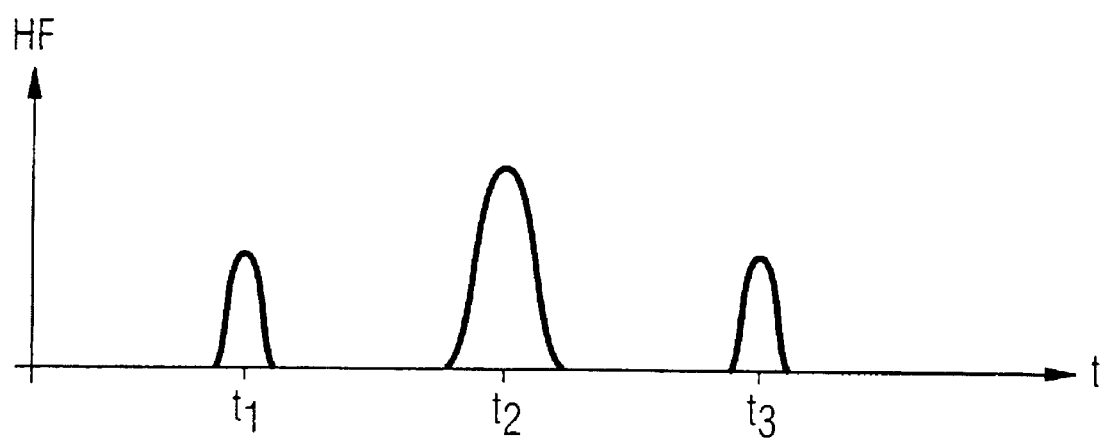
FIG. 3A shows a RF pulse sequence for fat suppression.
Figure 3B:
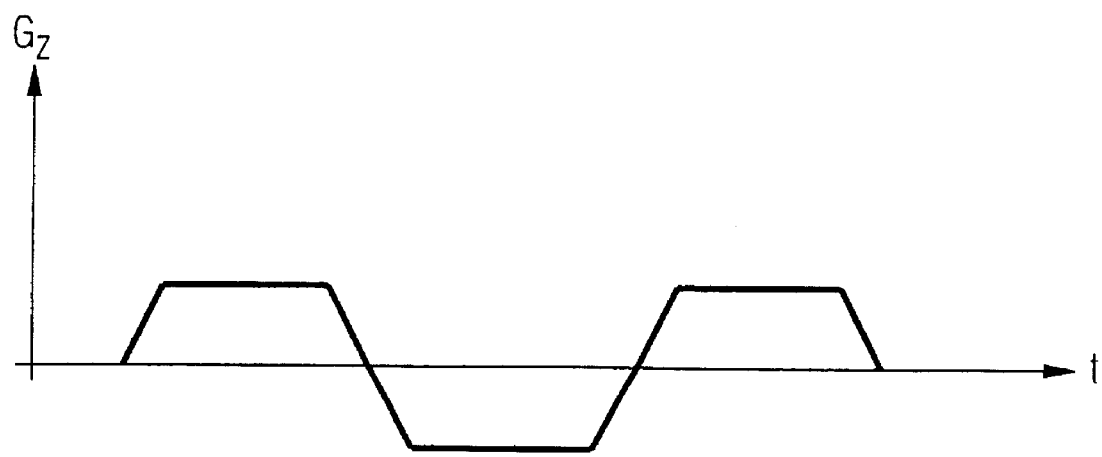
FIG. 3B shows the appertaining magnetic field gradient in the direction of the slice normal used with the sequence of FIG. 3A.

FIGS. 3A and 3B show an exemplary embodiment of a frequency-selective and location-selective RF pulse sequence with bipolar, selective magnetic field gradients. The intervals between the pulses ($t_2-t_1$ and $t_3-t_2$) are selected such that the time that elapses between two successive pulses corresponds exactly to a phase shift of 180° of the Larmor precession between the medium to be selected (for example, water) and the medium to be suppressed (for example, fat). With the first pulse at time $t_1$, the respective nuclear magnetization of both media are in phase. Up to time $t_2$, they have separated by 180°, so that a further magnetic field pulse emitted to both media effects exactly an opposite angular change of the respective magnetization (+α/2 and −α/2, respectively). With the third pulse, an overall angular change of α occurs given the medium to be selected and an overall angular change of 0 occurs at the medium to be suppressed. The pulse sequence shown in FIGS. 3A and 3B for selective excitation of a medium is shown only as an example and those skilled in the art are aware of and can utilize other suitable pulse sequences.

FIG. 1A shows the nuclear magnetization of the medium to be selected (water), and FIG. 1B shows the nuclear magnetization of the medium to be suppressed (fat) along the slice normal (z-axis) as a result of an inventive RF pulse sequence. The frequency of the second RF pulse is selected compared to the first and third RF pulse so that the spatial resonant region for the medium to be suppressed coincides with the pulses of opposite polarity (first and third pulses compared to second pulse). The first and third pulses produce a negative nuclear magnetization whose sum at each point of the z-axis is exactly compensated by the positive magnetization generated by the third pulse. Fat excitation is thus completely suppressed and no undesirable fat-originating noise signals occur. Due to the opposite polarity of the magnetic field, by contrast, a shift of the spatial excitation region between first and third pulses, and the second pulse occurs as outlined in FIG. 1A. The overall magnetization resulting from the pulse sequence is thus broadened along the z-axis, which effects a certain diminution of the signal-to-noise ratio of the desired signal. The advantage of the largely complete suppression of the fat component outweighs this disadvantage for most applications, however, by a great extent.

FIGS. 2A and 2B show the corresponding magnetization along the slice normal z produced by a frequency-selective and location-selective RF pulse sequence, using a conventional frequency compensation with respect to the selected medium. The nuclear magnetization for the selected medium, water, produced by the three pulses matched in their spatial distribution and thus add, whereas a shift of the slice profile of the individual pulses occurs in the fat magnetization. This leads to the fact that the edge regions lie only in the excitation region of one of the RF pulses of a gradient polarity, whereas the other RF pulses have no effect at this location. The fat. suppression is therefore incomplete in the edge regions (see the hatched region in FIG. 2b).

In the known method, a shift of, for example, 10% generates 20% additional slice edge regions for fat-frequency spins, the signal from which limits the obtainable fat suppression to approximately 20%, so that a considerable, undesirable noise signal remains, whereas a practically complete fat suppression is possible in the inventive method and apparatus.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance imaging method comprising the steps of:

subjecting an examination subject, containing a first medium and a second medium, to frequency-selective and location-selective RF pulses and bipolar, selective magnetic field gradients; and selectively producing nuclear magnetic resonant excitation is said first medium of said examination subject and suppressing excitation in said second medium of said examination subject by electing a frequency spectrum and said RF pulses so that a spatial resonance region of RF pulses for said second medium at a first polarity of said magnetic field gradient substantially coincides with a spatial resonance region of RF pulses of an opposite polarity of said magnetic field gradient, by subjecting said examination subject to a pulse sequence comprising three pulses spaced equidistantly from each other in time, including two outer pulses and a middle pulse, and effecting a rotation of the nuclear magnetization of the first medium and the second medium by an angle $\alpha/4$ in a first direction, and effecting a rotation of the nuclear magnetization of the first medium by an angle $\alpha/2$ in said first direction and effecting rotation of the nuclear magnetization of said second medium by an angle $\alpha/2$ in a second direction, opposite to said first direction, with said middle pulse.

2. A magnetic resonance imaging method as claimed in claim 1 comprising emitting said pulses in said pulse sequence with a time interval between the pulses corresponding to a phase difference of 180° between the nuclear magnetization of the first medium relative to the nuclear magnetization of the second medium.

3. A magnetic resonance imaging method as claimed in claim 2 comprising emitting said pulses sequence into an examination subject containing water as said first medium and fat as said second medium.

\* \* \* \* \*